(12) United States Patent
McDaniel et al.

(10) Patent No.: US 10,939,572 B2
(45) Date of Patent: *Mar. 2, 2021

(54) CIRCUIT BOARD ASSEMBLY

(71) Applicant: EMC IP Holding Company, LLC, Hopkinton, MA (US)

(72) Inventors: Ryan C. McDaniel, Hopkinton, MA (US); Stephen E. Strickland, Foxboro, MA (US); Brian D. Kennedy, Rutland, MA (US)

(73) Assignee: EMC IP Holding Company, LLC, Hopkinton, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/812,814

(22) Filed: Mar. 9, 2020

(65) Prior Publication Data
US 2020/0214162 A1    Jul. 2, 2020

Related U.S. Application Data

(63) Continuation of application No. 15/663,049, filed on Jul. 28, 2017, now Pat. No. 10,595,431.

(51) Int. Cl.
| | |
|---|---|
| *H05K 5/00* | (2006.01) |
| *H05K 7/14* | (2006.01) |
| *H05K 1/14* | (2006.01) |
| *H05K 3/46* | (2006.01) |
| *H05K 3/36* | (2006.01) |
| *H05K 1/11* | (2006.01) |
| *H05K 1/02* | (2006.01) |

(52) U.S. Cl.
CPC ........ *H05K 7/1439* (2013.01); *H05K 1/0278* (2013.01); *H05K 1/117* (2013.01); *H05K 1/141* (2013.01); *H05K 1/147* (2013.01); *H05K 3/361* (2013.01); *H05K 3/368* (2013.01); *H05K 3/4691* (2013.01)

(58) Field of Classification Search
USPC .................................................. 361/728, 752
See application file for complete search history.

(56) References Cited

U.S. PATENT DOCUMENTS

| | | |
|---|---|---|
| 6,721,189 B1 | 4/2004 | Haba |
| 7,145,776 B2 | 12/2006 | King, Jr. et al. |
| 7,593,225 B2 | 9/2009 | Sasagawa et al. |
| 7,768,280 B1 | 8/2010 | Wright et al. |
| 7,894,195 B2 | 2/2011 | Lin |
| 8,904,104 B2 | 12/2014 | Cho |

(Continued)

OTHER PUBLICATIONS

Non-Final Office Action issued in related U.S. Appl. No. 15/663,049, filed Oct. 2, 2018.

(Continued)

*Primary Examiner* — Hung S. Bui
(74) *Attorney, Agent, or Firm* — Brian J. Colandreo; Mark H. Whittenberger; Holland & Knight LLP

(57) ABSTRACT

A mid-plane assembly includes a main circuit board portion including a plurality of electrical connectors configured to releasably engage a plurality of devices, a first circuit board portion, and a first electrical coupling assembly configured to electrically couple the first circuit board portion to the main circuit board portion and position the first circuit board portion essentially orthogonal to the main circuit board portion.

14 Claims, 10 Drawing Sheets

(56) References Cited

U.S. PATENT DOCUMENTS

| | | |
|---|---|---|
| 9,167,725 B2 | 10/2015 | Chen et al. |
| 9,231,357 B1 | 1/2016 | Felton et al. |
| 9,357,666 B1 | 5/2016 | Felton et al. |
| 9,436,234 B1 | 9/2016 | Felton et al. |
| 10,031,561 B1 | 7/2018 | Strickland et al. |
| 10,595,431 B1 * | 3/2020 | McDaniel .............. H05K 3/361 |
| 2003/0111242 A1 | 6/2003 | Radu |
| 2005/0021887 A1 | 1/2005 | Benson et al. |
| 2012/0057317 A1 | 3/2012 | Lin |
| 2015/0351233 A1 | 12/2015 | Peterson et al. |

OTHER PUBLICATIONS

Final Office Action issued in related U.S. Appl. No. 15/663,049, filed Apr. 16, 2019.
Non-Final Office Action issued in related U.S. Appl. No. 15/663,049, filed Aug. 1, 2019.
Notice of Allowance issued in related U.S. Appl. No. 15/663,049, filed Nov. 18, 2019.

* cited by examiner

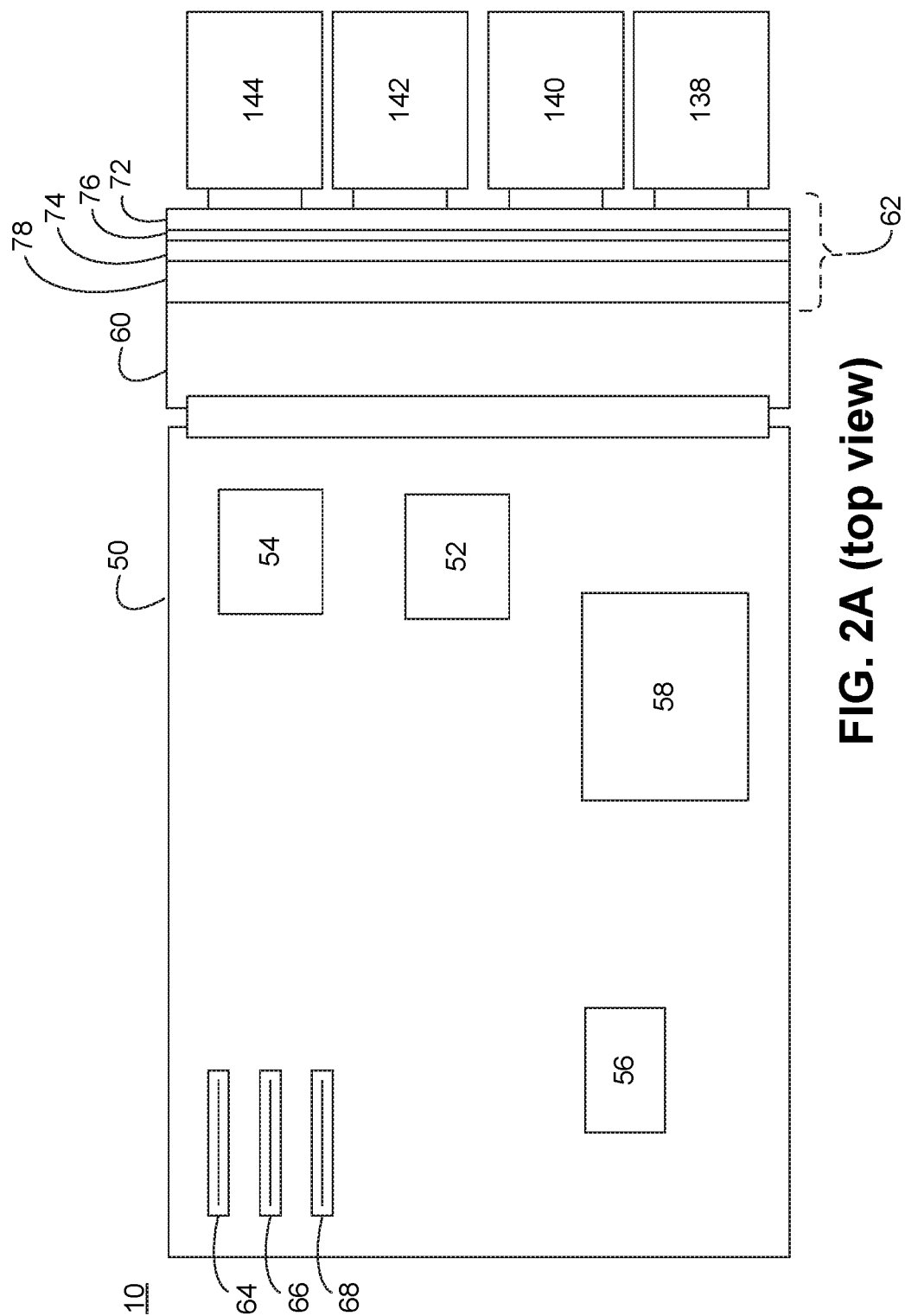
FIG. 2A (top view)

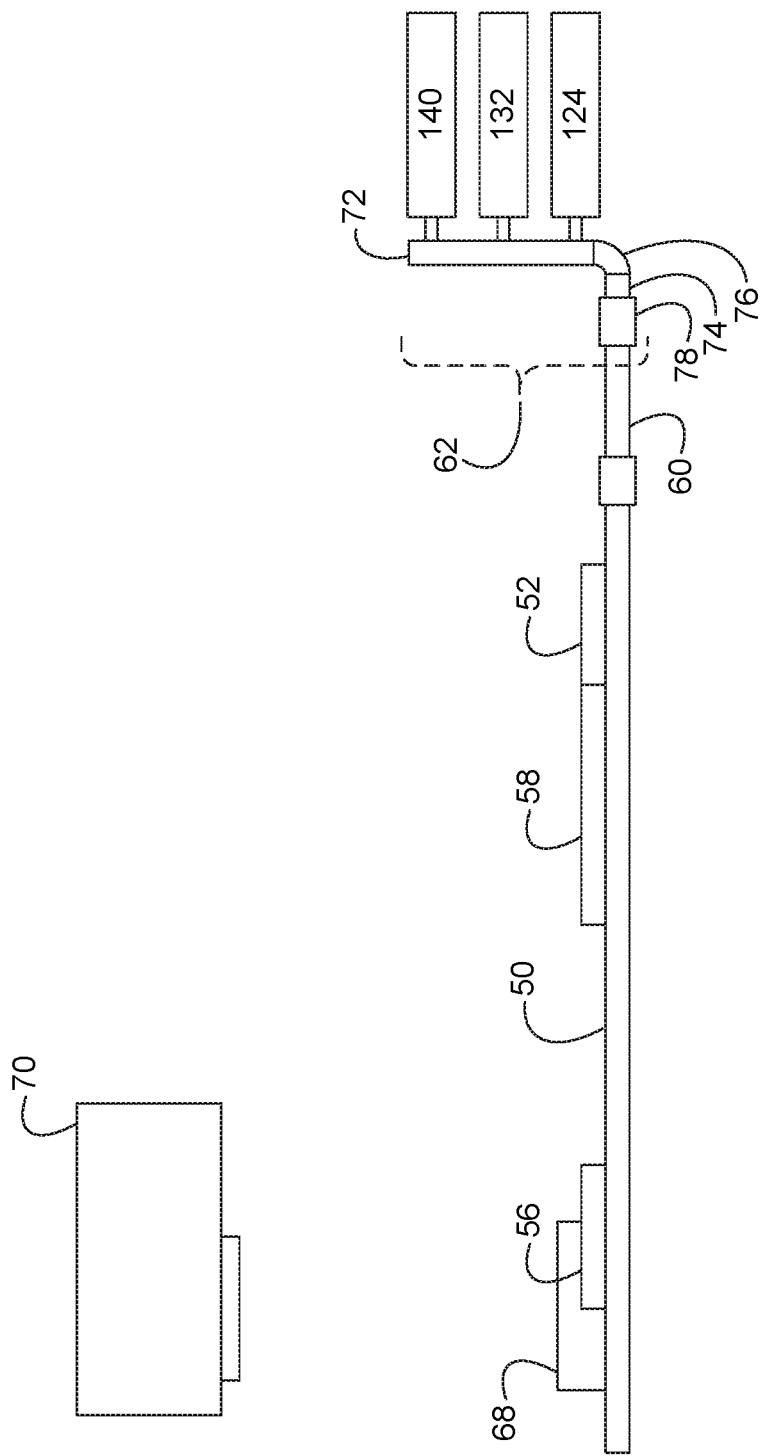
FIG. 2B (side view)

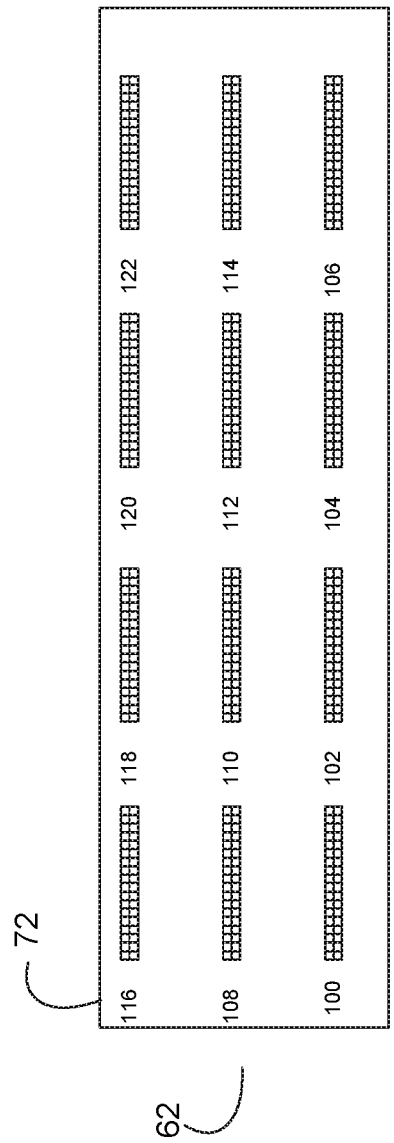
FIG. 2C (front view)
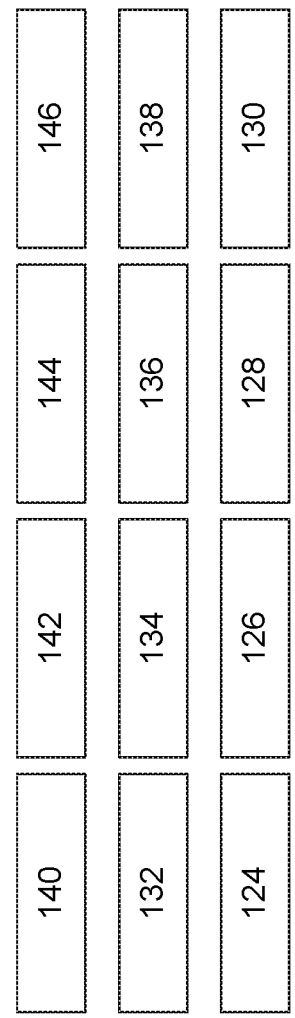
FIG. 2D (front view)

CIRCUIT BOARD ASSEMBLY

CROSS-REFERENCE TO RELATED APPLICATIONS

The subject application is a continuation of U.S. application Ser. No. 15/663,049; filed Jul. 28, 2017. The entire disclosure of which is herein incorporated by reference.

TECHNICAL FIELD

This disclosure relates to circuit boards and, more particularly, to flexible circuit boards for use within storage systems

BACKGROUND

In today's IT infrastructure, high availability is of paramount importance. Specifically, critical (and sometimes non-critical) components within an IT infrastructure are often layered in redundancy. For example, primary servers may be supported by backup servers; primary switches may be supported by backup switches; primary power supplies may be supported by backup power supplies; and primary storage systems may be supported by backup storage systems.

When designing such high availability devices, flexibility concerning the manner in which these devices are electrically coupled is highly important. Further, since enclosure space within these devices is at a premium, the ability to provide adequate cooling and ventilation is often complicated by other design criteria.

SUMMARY OF DISCLOSURE

In one implementation, a mid-plane assembly includes a main circuit board portion including a plurality of electrical connectors configured to releasably engage a plurality of devices and a first circuit board portion. A first electrical coupling assembly is configured to electrically couple the first circuit board portion to the main circuit board portion and position the first circuit board portion essentially orthogonal to the main circuit board portion.

One or more of the following features may be included. The first electrical coupling assembly may include a first flexible electrical coupling assembly. The first flexible electrical coupling assembly may include a first flexible printed circuit board. The first circuit board portion may include one or more electrical connectors configured to releasably engage a first controller board. The first circuit board portion may be configured to allow for side-to-side signal routing for the main circuit board portion. The mid-plane assembly may include a second circuit board portion and a second electrical coupling assembly configured to electrically couple the second circuit board portion to the main circuit board portion and position the second circuit board portion essentially orthogonal to the main circuit board portion. The second electrical coupling assembly may include a second flexible electrical coupling assembly. The second flexible electrical coupling assembly may include a second flexible printed circuit board. The second circuit board portion may include one or more electrical connectors configured to releasably engage a second controller board. The second circuit board portion may be configured to allow for side-to-side signal routing for the main circuit board portion. The main circuit board portion may include one or more cooling passages to allow for the passage of cooling air. The plurality of devices may include one or more of: a storage device; a network adapter; a graphics processor; a caching module; a graphical processing unit; and a compute module. The plurality of storage devices may include a plurality of rotating media storage devices. The plurality of storage devices may include a plurality of solid state storage devices. The main circuit board portion may include a plurality of main circuit board sub portions.

In another implementation, a mid-plane assembly includes a main circuit board portion including a plurality of electrical connectors configured to releasably engage a plurality of devices. A first circuit board portion includes one or more electrical connectors configured to releasably engage a first controller board, wherein the first circuit board portion is configured to allow for side-to-side signal routing for the main circuit board portion A first electrical coupling assembly is configured to electrically couple the first circuit board portion to the main circuit board portion and position the first circuit board portion essentially orthogonal to the main circuit board portion, wherein the first electrical coupling assembly includes a first flexible electrical coupling assembly.

One or more of the following features may be included. The mid-plane assembly may include a second circuit board portion including one or more electrical connectors configured to releasably engage a second controller board, wherein the second circuit board portion is configured to allow for side-to-side signal routing for the main circuit board portion, A second electrical coupling assembly is configured to electrically couple the second circuit board portion to the main circuit board portion and position the second circuit board portion essentially orthogonal to the main circuit board portion, wherein the second electrical coupling assembly includes a second flexible electrical coupling assembly. The plurality of devices may include one or more of: a storage device; a network adapter; a graphics processor; a caching module; a graphical processing unit; and a compute module.

In another implementation, a mid-plane assembly includes a main circuit board portion including a plurality of electrical connectors configured to releasably engage a plurality of devices. A first circuit board portion includes one or more electrical connectors configured to releasably engage a first controller board, wherein the first circuit board portion is configured to allow for side-to-side signal routing for the main circuit board portion. A first electrical coupling assembly is configured to electrically couple the first circuit board portion to the main circuit board portion and position the first circuit board portion essentially orthogonal to the main circuit board portion, wherein the first electrical coupling assembly includes a first flexible electrical coupling assembly. A second circuit board portion includes one or more electrical connectors configured to releasably engage a second controller board, wherein the second circuit board portion is configured to allow for side-to-side signal routing for the main circuit board portion. A second electrical coupling assembly is configured to electrically couple the second circuit board portion to the main circuit board portion and position the second circuit board portion essentially orthogonal to the main circuit board portion, wherein the second electrical coupling assembly includes a second flexible electrical coupling assembly.

One or more of the following features may be included. The main circuit board portion may include one or more cooling passages to allow for the passage of cooling air.

The details of one or more implementations are set forth in the accompanying drawings and the description below.

Other features and advantages will become apparent from the description, the drawings, and the claims.

BRIEF DESCRIPTION OF THE DRAWINGS

FIGS. 2A-2E are diagrammatic views of a mid-plane assembly included within the IT device of FIG. 1.

Like reference symbols in the various drawings indicate like elements.

DETAILED DESCRIPTION OF THE PREFERRED EMBODIMENTS

Figure 1:
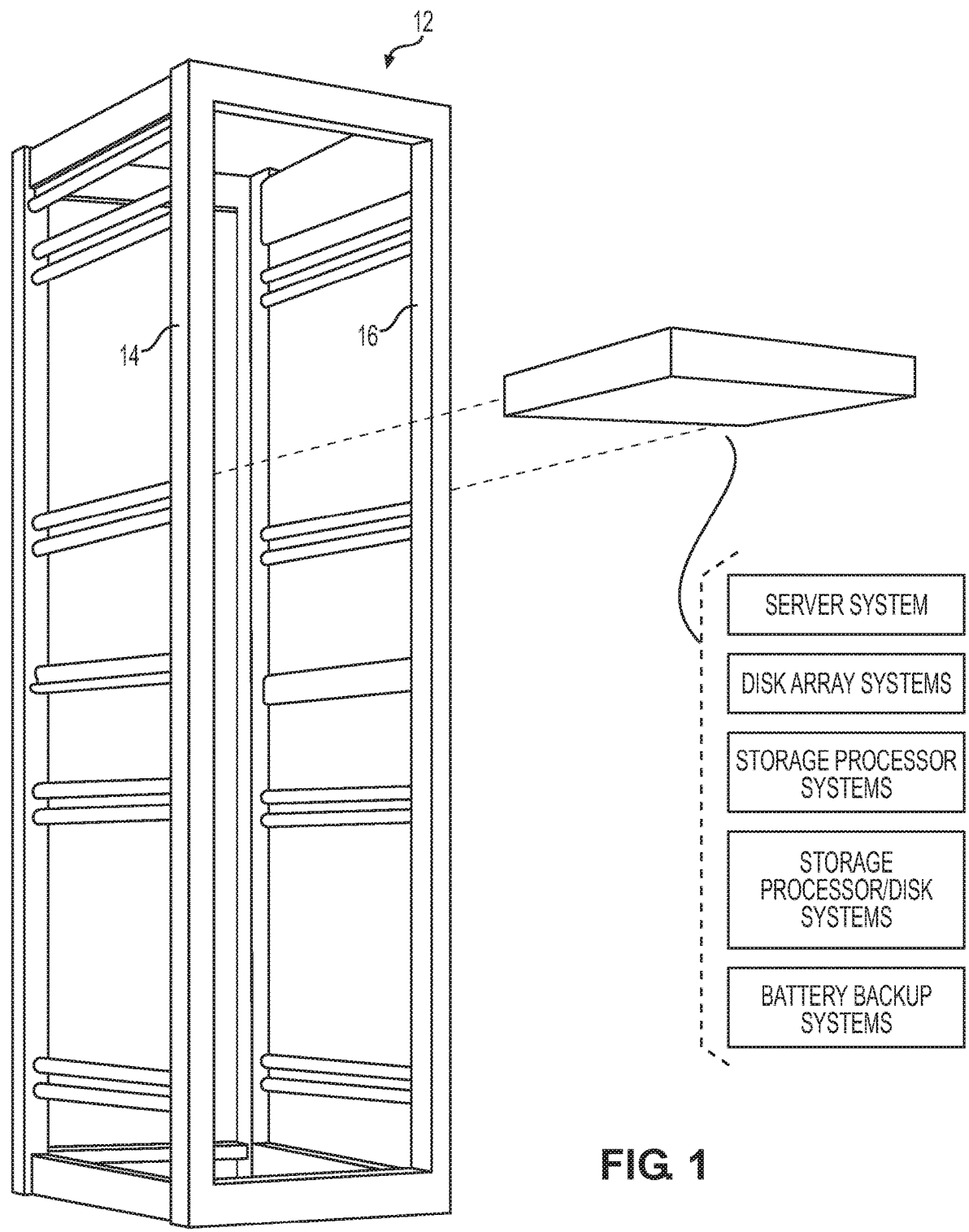
FIG. 1 is a perspective view of an IT rack and an IT device.

Referring to FIG. 1, IT devices (e.g., IT device 10) may be utilized by organizations to process and store data. Examples of IT device 10 may include but are not limited to the various components of high-availability storage systems, such as: server systems, disk array systems, storage processor systems, storage processor/disk systems, and battery backup systems.

IT racks (e.g., IT rack 12) may be utilized to store and organize these IT devices (e.g., IT device 10). For example, IT rack 12 may be placed within a computer room and various IT devices may be attached to rails (e.g., NEMA rails 14, 16) included within IT rack 12, wherein these rails (e.g., NEMA rails 14, 16) may have a standard and defined spacing between them (e.g., 19"). Typically, IT devices that are configured to fit within IT rack 12 may be described as rack-mountable IT devices. Alternatively. IT device 10 may be a free-standing device that does not require an IT rack for mounting.

Referring also to FIGS. 2A-2D, positioned within IT device 10 may be one or more system boards (e.g., first controller board 50) that may include a plurality of circuits 52, 54, 56, 58, examples of which may include but are not limited to one or more processors, memory circuits, voltage regulator circuits, and memory controller circuits.

IT device 10 may include a drive controller system (e.g., drive controller system 60) that may be electrically coupled to first controller board 50. Alternatively, drive controller system 60 may be a portion of (i.e., included within) first controller board 50. A mid-plane assembly (e.g., mid-plane assembly 62) may be electrically coupled to drive controller system 60 (or electrically coupled to first controller board 50 when drive controller system 60 is a portion of (i.e., included within) first controller board 50).

Mid-plane assembly 62 may include a plurality of electrical connectors (e.g., electrical connectors 100, 102, 104, 106, 108, 110, 112, 114, 116, 118, 120, 122) that may be configured to electrically couple mid-plane assembly 62 to a plurality of devices (e.g., devices 124, 126, 128, 130, 132, 134, 136, 138, 140, 142, 144, 146 respectively). An example of electrical connectors 100, 102, 104, 106, 108, 110, 112, 114, 116, 118, 120, 122 may include but is not limited to an SFF-8639 connector.

While the electrical connectors (e.g., electrical connectors 100, 102, 104, 106, 108, 110, 112, 114, 116, 118, 120, 122) are shown to be positioned in a horizontal fashion, this is for illustrative purposes only and is not intended to be a limitation of this disclosure, as other configurations are possible and are considered to be within the scope of this disclosure. For example, the electrical connectors (e.g., electrical connectors 100, 102, 104, 106, 108, 110, 112, 114, 116, 118, 120, 122) may be positioned in a vertical fashion (as will be discussed below).

As discussed above, IT device 10 may include one or more controller boards (e.g., first controller board 50) that may include a plurality of circuits 52, 54, 56, 58, wherein examples of these circuits may include but are not limited to one or more processors, memory circuits, voltage regulator circuits, and memory controller circuits. First controller board 50 may further include one or more expansion slots (e.g., expansion card slots 64, 66, 68) that may be electrically coupled to first controller board 50 and may each be configured to receive an expansion card (such as expansion card 70). An example of expansion card 70 may include, but is not limited to, a PCI Express (PCIe) expansion card.

While in this particular example, first controller board 50 is shown to include three expansion slots (e.g., expansion slots 64, 66, 68), this is for illustrative purposes only and is not intended to be a limitation of this disclosure, as other configuration are possible. For example, first controller board 50 may include zero expansion slots.

Mid-plane assembly 62 may include main circuit board portion 72 that includes the plurality of electrical connectors (e.g., drive connectors 100, 102, 104, 106, 108, 110, 112, 114, 116, 118, 120, 122) configured to releasably engage the plurality of devices (e.g., devices 124, 126, 128, 130, 132, 134, 136, 138, 140, 142, 144, 146 respectively).

Examples of the plurality of devices (e.g., devices 124, 126, 128, 130, 132, 134, 136, 138, 140, 142, 144, 146) may include but is not limited to one or more of: a storage device; a network adapter; a graphics processor; a caching module; a graphical processing unit; and a compute module. Accordingly, plurality of devices (e.g., devices 124, 126, 128, 130, 132, 134, 136, 138, 140, 142, 144, 146) may include a plurality of rotating media storage devices and/or a plurality of solid state storage devices. Devices 124, 126, 128, 130, 132, 134, 136, 138, 140, 142, 144, 146 may include one or more hot-swappable devices that may be coupled to and/or decoupled from mid-plane assembly 62 during the operation of IT device 10.

While, in this example, mid-plane assembly 62 is shown to accommodate twelve devices (e.g., devices 124, 126, 128, 130, 132, 134, 136, 138, 140, 142, 144, 146), this is for illustrative purposes only and is not intended to be a limitation of this disclosure, as the actual number of devices may be increased/decreased based upon design criteria.

Mid-plane assembly 62 may also include first circuit board portion 74. Mid-plane assembly 62 may also include first electrical coupling assembly 76 configured to electrically couple first circuit board portion 74 to main circuit board portion 72 and position first circuit board portion 74 essentially orthogonal to main circuit board portion 72. An example of first electrical coupling assembly 76 may include but is not limited to a first flexible electrical coupling assembly (such as a first flexible printed circuit board). For example, mid-plane assembly 62 may include an integral flexible printed circuit board through its entirety, wherein rigid material (e.g., glass-epoxy material) may be applied to main circuit board portion 72 and first circuit board portion 74.

First circuit board portion 74 may include one or more electrical connectors (e.g., electrical connectors 78) configured to releasably engage first controller board 50 directly (or indirectly through drive controller system 60).

Figure 2E:
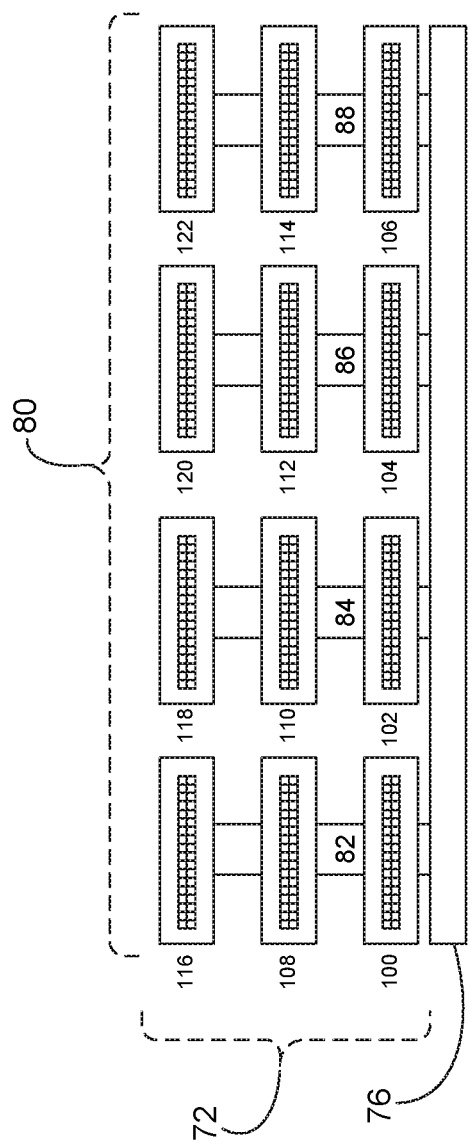
Figure 3A:
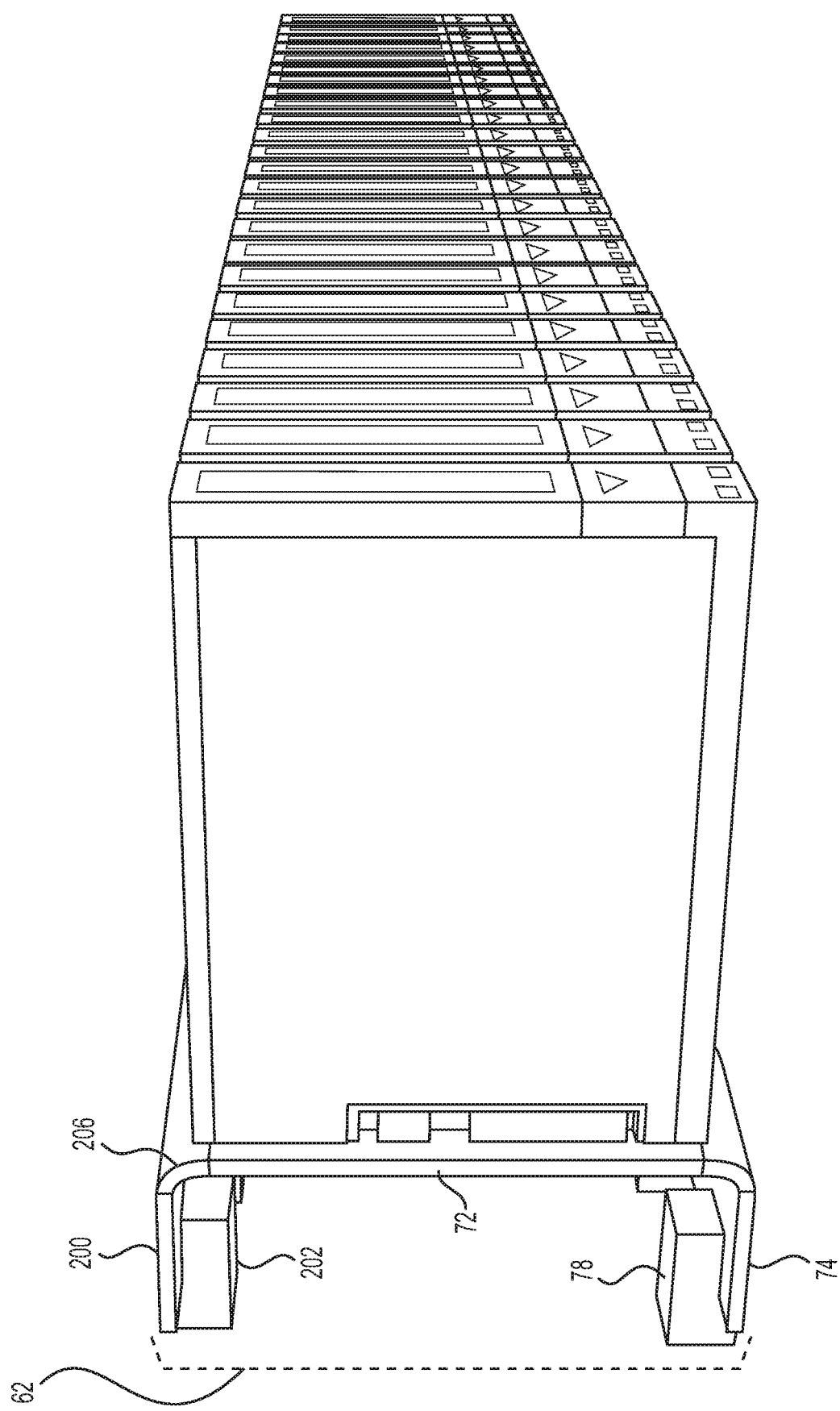
FIGS. 3A-3E are diagrammatic views of an alternative embodiment of the mid-plane assembly of FIGS. 2A-2E.
Figure 3B:
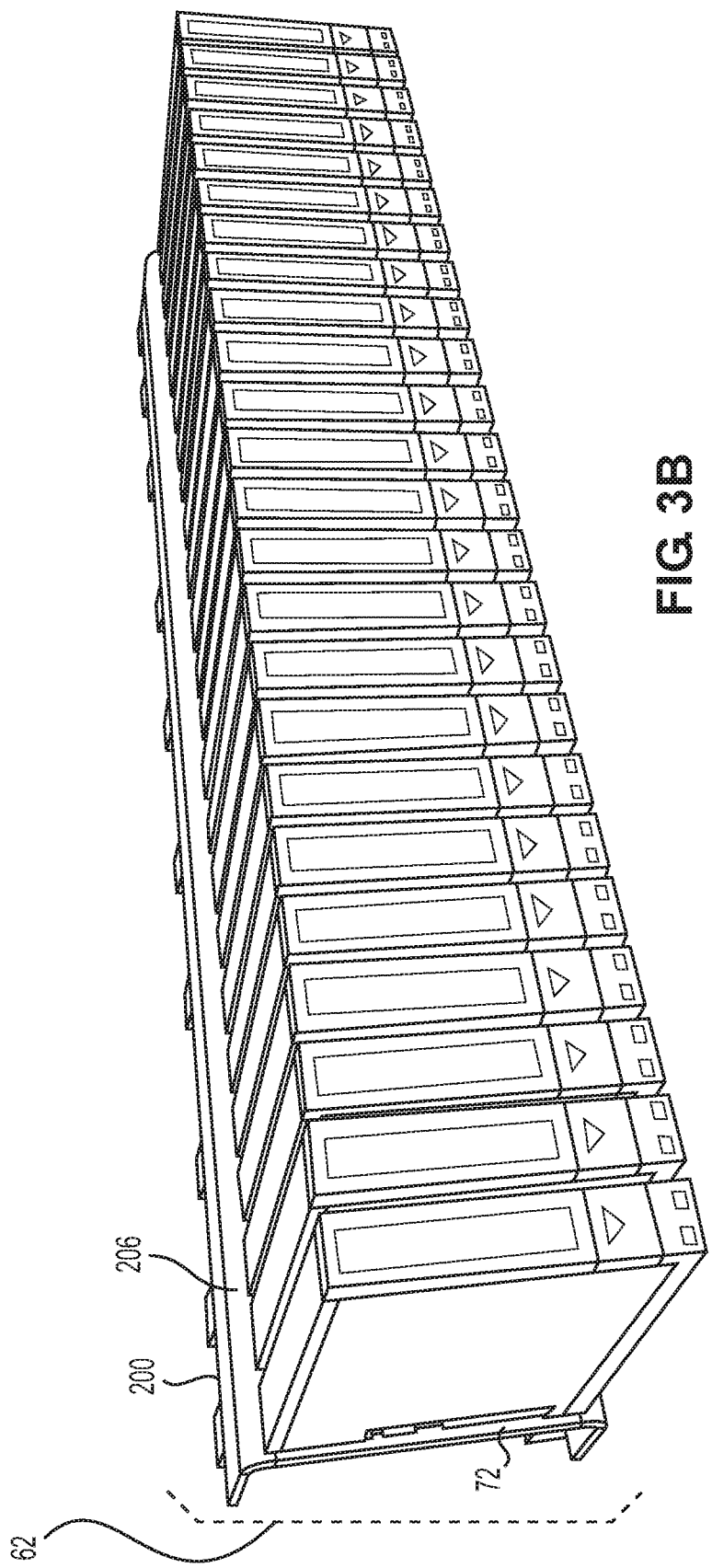
Figure 3C:
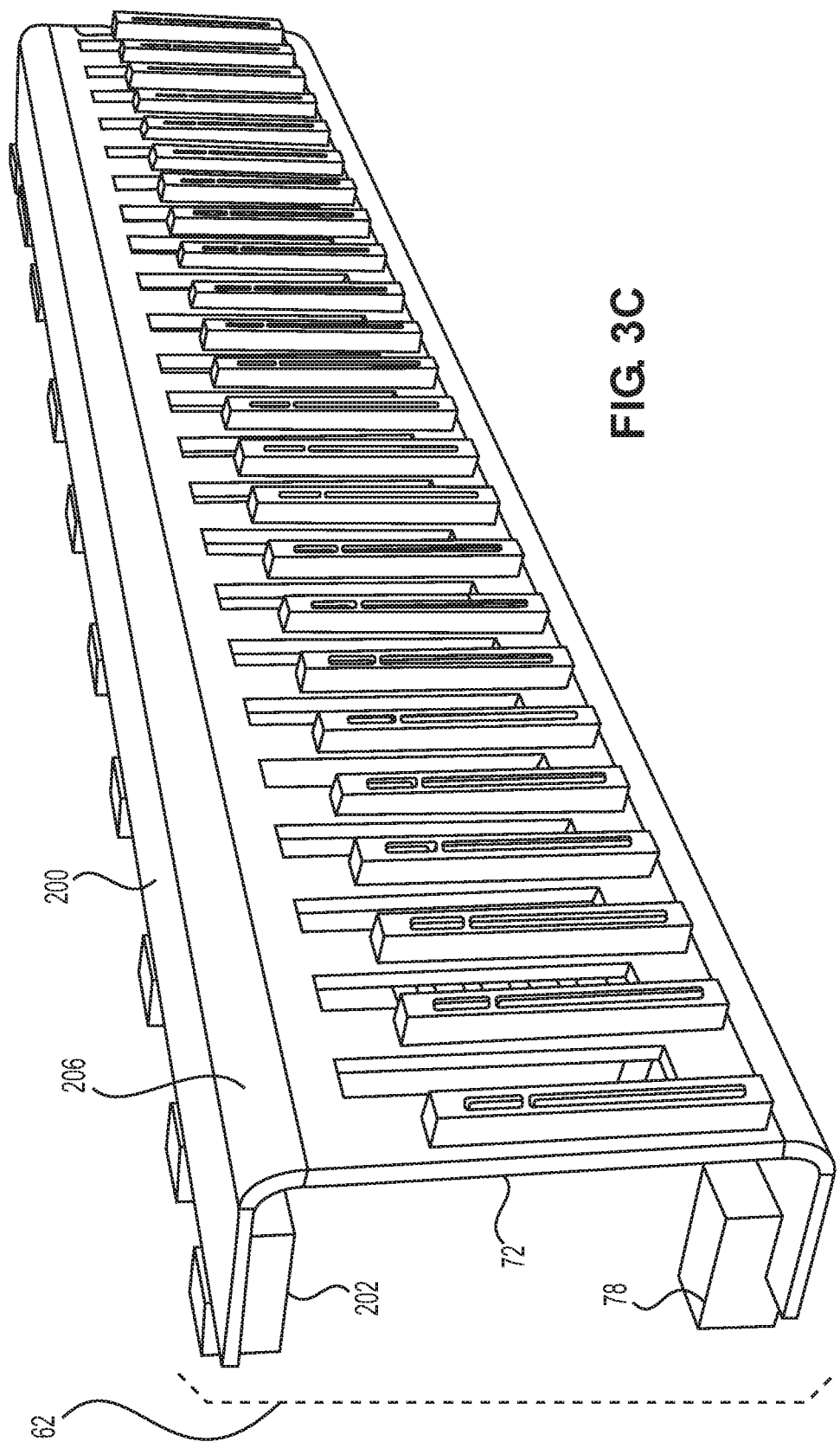
Figure 3D:
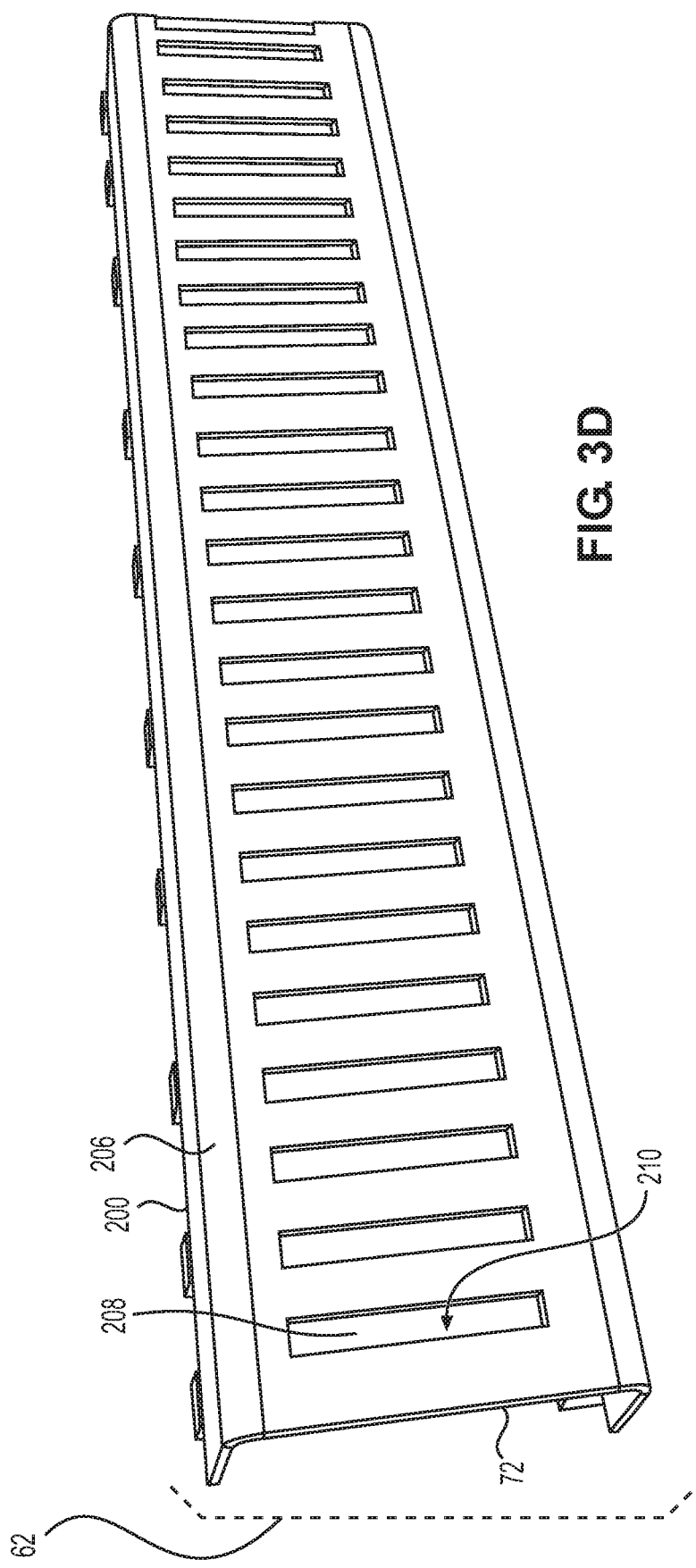
Figure 3E:
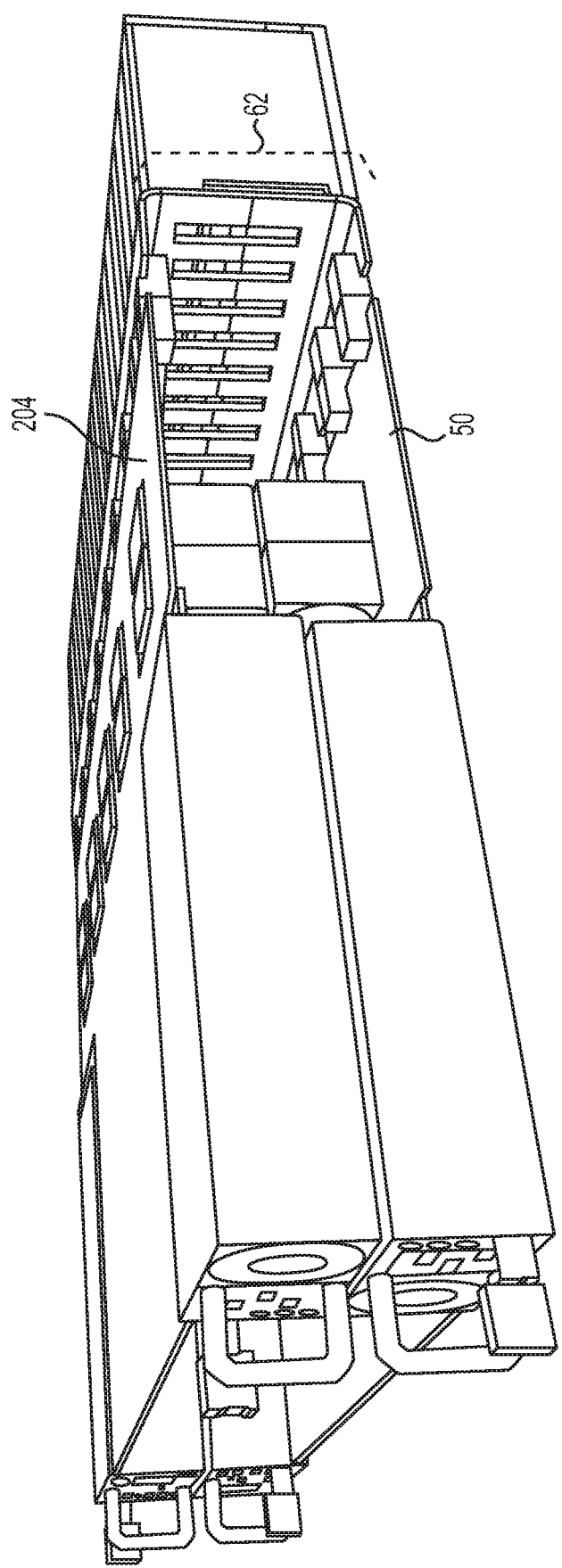

Referring also to FIG. 2E and while main circuit board portion 72 is shown to be a unitary circuit board, other configurations are possible and are considered to be within the scope of this disclosure. For example, main circuit board portion 72 may include a plurality of main circuit board sub portions (e.g., plurality of main circuit board sub portions 80) that are coupled with electrical connectors 82, 84, 86, 88 to e.g., first electrical coupling assembly 76.

Referring also to FIGS. 3A-3E, there is shown another implementation of mid-plane assembly 62, wherein mid-plane assembly 62 is shown to include second circuit board portion 200 that may include one or more electrical connectors (e.g., electrical connectors 202) configured to releasably engage second controller board 204. As with first controller board 50, second controller board 204 may include a plurality of circuits (not shown), examples of which may include but are not limited to one or more processors, memory circuits, voltage regulator circuits, and memory controller circuits.

Second electrical coupling assembly 206 may be configured to electrically couple second circuit board portion 200 to main circuit board portion 72 and position second circuit board portion 200 essentially orthogonal to main circuit board portion 72. An example of second electrical coupling assembly 206 may include but is not limited to a second flexible electrical coupling assembly (such as a second flexible printed circuit board). As discussed above, mid-plane assembly 62 may include an integral flexible printed circuit board through its entirety, wherein rigid material (e.g., glass-epoxy material) may be applied to main circuit board portion 72, first circuit board portion 74 and second circuit board portion 200.

First circuit board portion 74 and/or second circuit board portion 200 may be configured to allow for side-to-side signal routing along main circuit board portion 72. Therefore and through the use of first circuit board portion 74 and/or second circuit board portion 200, the routing of one or more signals (not shown) longitudinally along main circuit board portion 72 may be effectuated by e.g., routing the one or more signals onto either first circuit board portion 74 or second circuit board portion 200 so that the one or more signals may be routed longitudinally to the desired position (via either first circuit board portion 74 or second circuit board portion 200) and then routed back onto main circuit board portion 72.

Accordingly and by utilizing first circuit board portion 74 and/or second circuit board portion 200 to effectuate the longitudinal routing of signals along main circuit board 72, main circuit board portion 72 may be configured to allow for enhanced cooling. For example, main circuit board portion 72 may include one or more cooling passages (e.g., cooling passage 208) to allow for the passage of cooling air (e.g., cooling air 210), thus allowing for the cooling of the plurality of devices (e.g., devices 124, 126, 128, 130, 132, 134, 136, 138, 140, 142, 144, 146).

GENERAL

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

A number of implementations have been described. Having thus described the disclosure of the present application in detail and by reference to embodiments thereof, it will be apparent that modifications and variations are possible without departing from the scope of the disclosure defined in the appended claims.

What is claimed is:

1. A mid-plane assembly comprising:
    a main circuit board portion including a plurality of electrical connectors configured to releasably engage a plurality of devices, wherein the main circuit board portion includes one or more cooling passages within the main circuit board disposed between at least a portion of the plurality of electrical connectors to allow for the passage of cooling air between the at least a portion of the plurality of electrical connectors;
    a first circuit board portion, wherein the first circuit board portion includes one or more electrical connectors configured to releasably engage a first controller board;
    a first electrical coupling assembly configured to electrically couple the first circuit board portion to the main circuit board portion and position the first circuit board portion essentially orthogonal to the main circuit board portion, wherein the first electrical coupling assembly includes a first flexible electrical coupling assembly;
    a second circuit board portion; and
    a second electrical coupling assembly configured to electrically couple the second circuit board portion to the main circuit board portion and position the second circuit board portion essentially orthogonal to the main circuit board portion.

2. The mid-plane assembly of claim 1 wherein the first flexible electrical coupling assembly includes a first flexible printed circuit board.

3. The mid-plane assembly of claim 1 wherein the first circuit board portion is configured to allow for side-to-side signal routing for the main circuit board portion.

4. The mid-plane assembly of claim 1 wherein the second electrical coupling assembly includes a second flexible electrical coupling assembly.

5. The mid-plane assembly of claim 4 wherein the second flexible electrical coupling assembly includes a second flexible printed circuit board.

6. The mid-plane assembly of claim 1 wherein the second circuit board portion includes one or more electrical connectors configured to releasably engage a second controller board.

7. The mid-plane assembly of claim 1 wherein the second circuit board portion is configured to allow for side-to-side signal routing for the main circuit board portion.

8. The mid-plane assembly of claim 1 wherein the plurality of devices includes one or more of:
a storage device;
a network adapter;
a graphics processor;
a caching module;
a graphical processing unit; and
a compute module.

9. The mid-plane assembly of claim 8 wherein the plurality of storage devices includes:
a plurality of rotating media storage devices.

10. The mid-plane assembly of claim 8 wherein the plurality of storage devices includes:
a plurality of solid state storage devices.

11. The mid-plane assembly of claim 1 wherein the main circuit board portion includes:
a plurality of main circuit board sub portions.

12. A mid-plane assembly comprising:
a main circuit board portion including a plurality of electrical connectors configured to releasably engage a plurality of devices, wherein the main circuit board portion includes one or more cooling passages within the main circuit board disposed between at least a portion of the plurality of electrical connectors to allow for the passage of cooling air between the at least a portion of the plurality of electrical connectors;
a first circuit board portion including one or more electrical connectors configured to releasably engage a first controller board, wherein the first circuit board portion is configured to allow for side-to-side signal routing for the main circuit board portion;
a first electrical coupling assembly configured to electrically couple the first circuit board portion to the main circuit board portion and position the first circuit board portion essentially orthogonal to the main circuit board portion;
a second circuit board portion including one or more electrical connectors configured to releasably engage a second controller board, wherein the second circuit board portion is configured to allow for side-to-side signal routing for the main circuit board portion; and
a second electrical coupling assembly configured to electrically couple the second circuit board portion to the main circuit board portion and position the second circuit board portion essentially orthogonal to the main circuit board portion.

13. The mid-plane assembly of claim 12 wherein the plurality of devices includes one or more of:
a storage device;
a network adapter;
a graphics processor;
a caching module;
a graphical processing unit; and
a compute module.

14. A mid-plane assembly comprising:
a main circuit board portion including a plurality of electrical connectors configured to releasably engage a plurality of devices, wherein the main circuit board portion includes one or more cooling passages within the main circuit board disposed between at least a portion of the plurality of electrical connectors to allow for the passage of cooling air between the at least a portion of the plurality of electrical connectors;
a first circuit board portion including one or more electrical connectors configured to releasably engage a first controller board, wherein the first circuit board portion is configured to allow for side-to-side signal routing for the main circuit board portion;
a first electrical coupling assembly configured to electrically couple the first circuit board portion to the main circuit board portion and position the first circuit board portion essentially orthogonal to the main circuit board portion, wherein the first electrical coupling assembly includes a first flexible electrical coupling assembly;
a second circuit board portion including one or more electrical connectors configured to releasably engage a second controller board, wherein the second circuit board portion is configured to allow for side-to-side signal routing for the main circuit board portion; and
a second electrical coupling assembly configured to electrically couple the second circuit board portion to the main circuit board portion and position the second circuit board portion essentially orthogonal to the main circuit board portion, wherein the second electrical coupling assembly includes a second flexible electrical coupling assembly.

* * * * *